United States Patent [19]
Imamura

[11] Patent Number: 5,608,329
[45] Date of Patent: Mar. 4, 1997

[54] CIRCUIT TEST DEVICE

[75] Inventor: Makoto Imamura, Tokyo, Japan

[73] Assignee: Yokogawa Electric Corporation, Tokyo, Japan

[21] Appl. No.: 393,965

[22] Filed: Feb. 24, 1995

[30] Foreign Application Priority Data

Mar. 8, 1994 [JP] Japan .................................. 6-036745

[51] Int. Cl.⁶ ............................ G01R 31/00; G01R 31/26
[52] U.S. Cl. ...................... 324/537; 324/158.1; 324/765
[58] Field of Search .................................. 324/537, 765, 324/555, 713, 719, 158.1

[56] References Cited

U.S. PATENT DOCUMENTS

| | | | |
|---|---|---|---|
| 4,408,128 | 10/1983 | Fujita | 324/713 |
| 4,706,015 | 11/1987 | Chen | 324/719 |
| 4,733,173 | 3/1988 | Bach et al. | 324/765 |
| 4,998,026 | 3/1991 | King | 324/537 X |
| 5,552,712 | 9/1996 | Weir et al. | 324/537 |

*Primary Examiner*—Kenneth A. Wieder
*Assistant Examiner*—Glenn W. Brown
*Attorney, Agent, or Firm*—Moonray Kojima

[57] ABSTRACT

A circuit test device for carrying out a DC Test and a Function Test on a test object without using a relay, wherein a first differential circuit receives a signal from a test object; a current source supplies a current to the test object; a second differential circuit receives an output from the first differential circuit and supplies a current to the test object; a current measuring circuit measures the current flowing through the second differential circuit; and a control circuit controls the current source and the current in the second differential circuit while applying a voltage to the first differential circuit and provides a set voltage to the first differential circuit for the test object when carrying out the DC Test, and provides a set current in the second differential circuit when carrying out the Function Test.

5 Claims, 4 Drawing Sheets

5,608,329

CIRCUIT TEST DEVICE

BACKGROUND OF THE INVENTION

1. Field of Invention

This invention relates to a circuit test device which switches between a DC characteristic test and a function test of a test object without using a relay.

2. Description of the Prior Art

In testing a circuit, such as one comprising an integrated circuit or semiconductors, one may use a direct current characteristic test (hereinafter called "DC Test"). Another test is the function test, wherein the function of the circuit is tested (called "Function Test").

The DC Test is a test of the input or output of the test object (hereinafter called "DUT") and the power source system used therewith. Generally, there are two types of DC Tests; one test type is called the VSIM (V source I measure) for measuring a current when a pre-determined voltage is applied to the DUT; the other type is called the ISVM (I source V measure) for measuring a voltage when a predetermined current is applied to the DUT.

The Function Test is a test for deciding whether the DUT is favorable or not (i.e. Operationally suitable or not) by applying a clock signal and an input pattern to the input of the DUT to compare the output of the DUT with an expected pattern.

The operation of the circuit test using the conventional circuit test device will now be discussed. This conventional circuit is described in the Silver Series No. 8, LSI Testing Technology, p 189, Published Dec. 25, 1986 by Tricupps Co., Ltd.

FIG. 1 shows the pin electronics of a conventional circuit test device, wherein a DC test is performed by releasing relays RL1 and RL2 and connecting relays RL3 and RL4 so that a DUT 1 is connected to the DC measuring circuit. When a signal is outputted to the DUT by releasing relays RL3 and RL4 and connecting relays RL1 and RL2, the input pattern is converted into a high level pulse waveform $V_{IH}$ and a low level pulse waveform $V_{IL}$ by a driver 2. The waveforms are outputted to DUT 1. Where a signal is inputted from DUT 1, the output waveforms of DUT 1 are compared, in level, with a high comparative voltage $V_{OH}$ and a low comparative voltage $V_{OL}$, respectively, by comparators 3 and 4. A decision circuit 5 compares the results of level comparison with an expected pattern at the timing of a strobe signal, to determine whether the DUT 1 is favorable or not. In this case, an I/O signal is determined depending on whether the pin electronics is an output signal or an input signal. In other words, driver 2 is controlled in three stages with the I/O signal. In addition, a MASK signal refers to a signal which does not require a decision by decision circuit 5.

In order to eliminate the effect of the structure of the DC Test on a Function Test, switching between the DC Test and the Function Test has been peformed by a relay. However, in recent years, miniaturization of test devices has become the norm, and when a relay is used in such devices, the following problems arise. Namely, when the relay is provided on pin electronics, an IC cannot be used in the pin electronics in a miniaturized test device. Also, pin electronics requires a large number of pins amounting to as many as 256 or 512 pins. Accordingly, the number of relays becomes large and miniaturization of test devices utilizing such numbers of relays is hindered. Also, the use of relays reduces reliability of such test circuit devices.

SUMMARY OF THE INVENTION

Accordingly, an object of the invention is to overcome the foregoing and other deficiencies and disadvantages of the prior art.

Another object is to provide a circuit test device which can perform the Function Test and the DC Characteristic Test without using a relay.

DETAILED DESCRIPTION OF THE PREFERRED EMBODIMENTS

Figure 1:
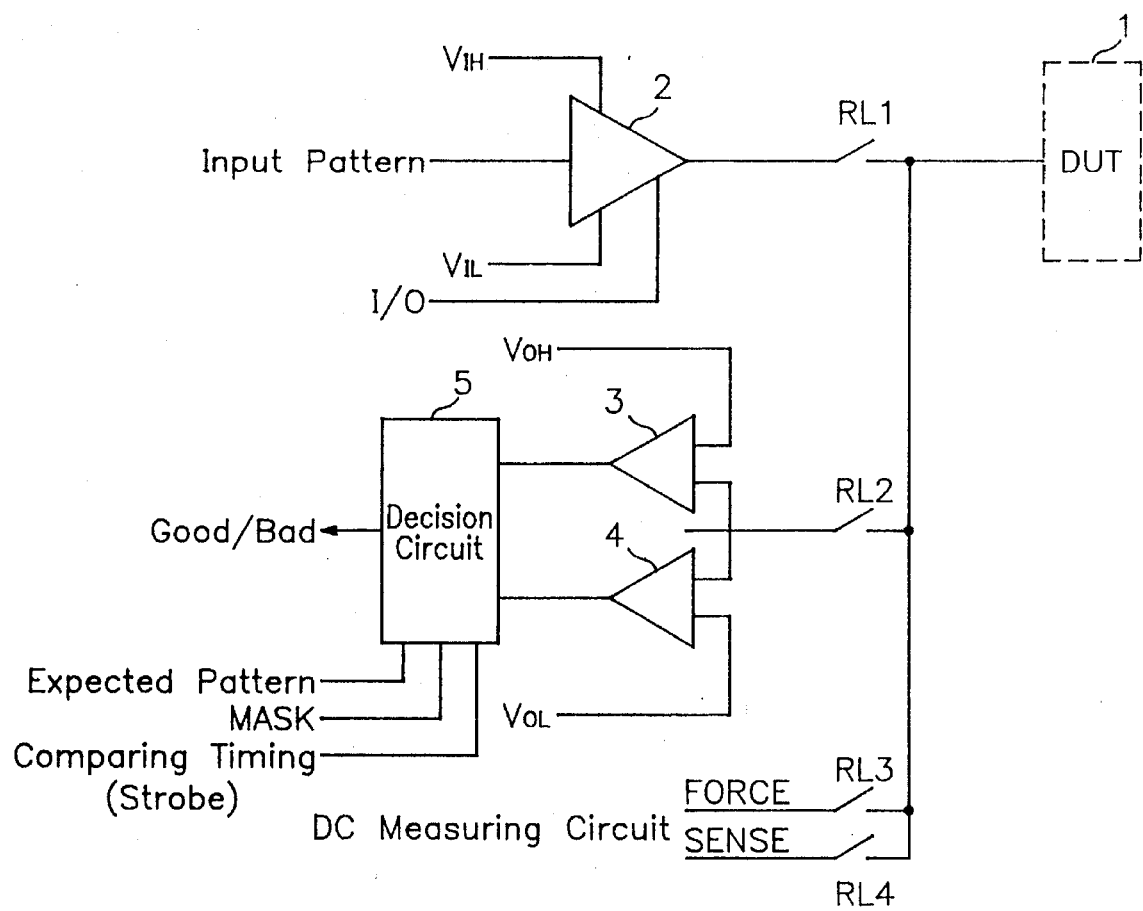
FIG. 1 is a block diagram depicting the pin electronics of a conventional circuit test device.
Figure 2:
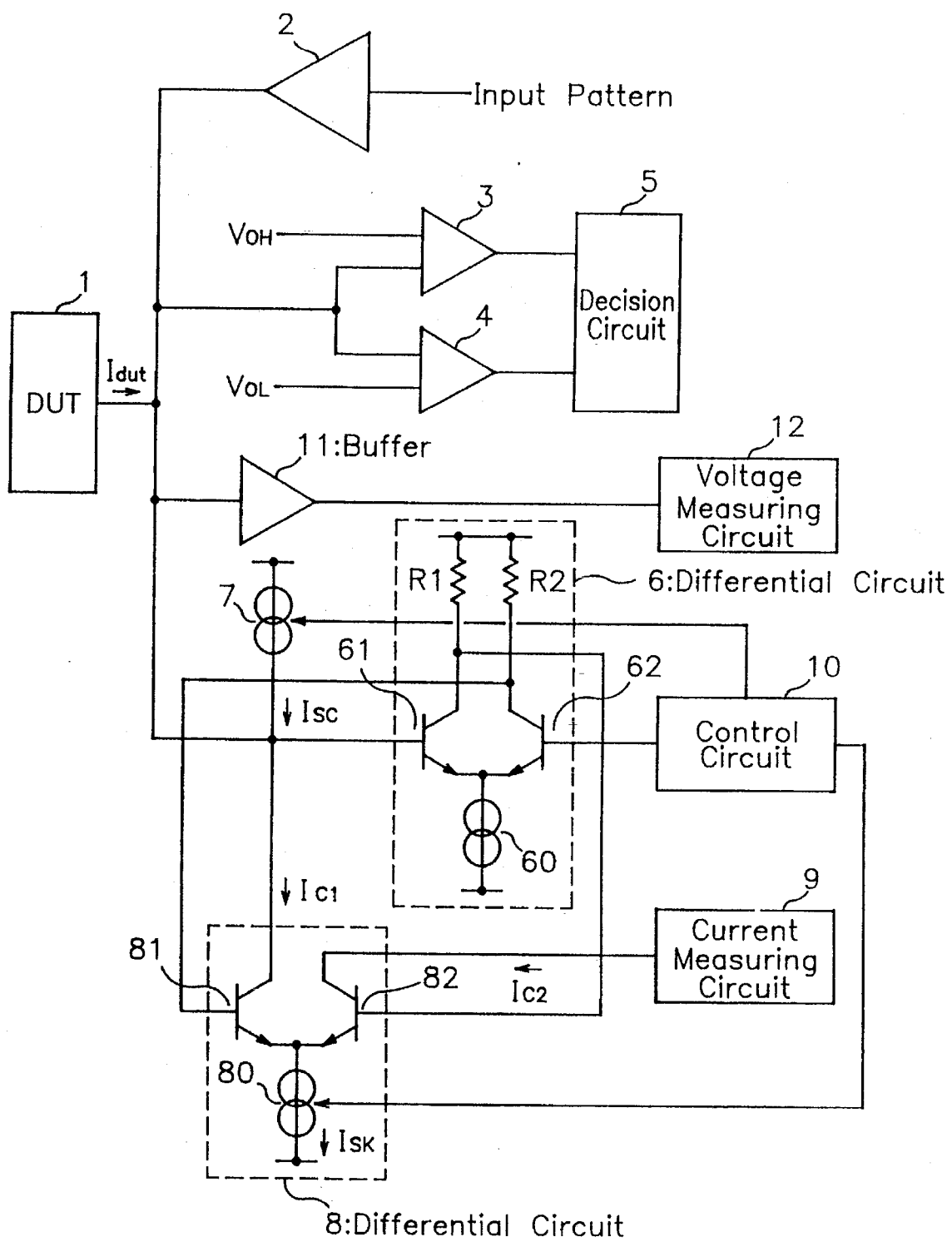
FIG. 2 is a block diagram depicting an illustrative embodiment of the invention.

FIG. 2, wherein like parts with FIG. 1 are labelled with like symbols, shows an illustrative embodiment comprising a first differential circuit 6, wherein a signal from DUT 1 is inputted to one input terminal thereof; a current source 7, which is connected in the manner depicted to DUT 1 to supply a current thereto; a second differential circuit 8 to which the output from first differential circuit 6 is inputted with one of its output terminals being connected to DUT 1 to supply a current thereto; a current measuring circuit 9 connected to the other output terminal of second differential circuit 8; a control circuit 10 for applying a voltage to the other input terminal of first differential circuit 6 to control current source 7 so that the current from current source 7 determines the operation current of second differential circuit 8.

A buffer 11 is connected to DUT 1 and to a voltage measuring circuit 12, which measures the voltage applied to DUT 1 via buffer 11.

First differential circuit 6 comprises a current source 60 for supplying a rated current; transistors 61 and 62, whose collectors are respectively connected to resistors R1 and R2, which convert the output from first differential circuit 6 into a voltage value, and whose emitters are connected to each other and to current source 60. The base of transistor 61 is connected to DUT 1 and the base of transistor 62 is connected to control circuit 10.

Second differential circuit 8 comprises a current source 80, whose current is controlled by control circuit 10; and transistors 81 and 82, whose emitters are connected to each other and to current source 80. The base of transistor 81 is connected to the collector of transistor 62 and the base of transistor 82 is connected to the collector of transistor 61. The collector of transistor 81 is connected to DUT 1 and the collector of transistor 82 is connected to current measuring circuit 9.

The operation of the embodiment will now be discussed with reference to the type of test involved.

VSIM TYPE OF TEST

Control circuit 10 sets current sources 7 and 80 so that current sources 7 and 80 allow currents $I_{SC}$ and $I_{SK}$ to pass therethrough to provide a voltage at the measuring terminal of DUT 1 to another input terminal of first differential circuit 6 as a set voltage. Then, first differential circuit 6 compares the voltage at the measuring terminal of DUT 1 with the set voltage from control circuit 10. As a result, when voltage at the measuring terminal of DUT 1 is higher than the set voltage, a voltage higher than the counterpart of transistor 82 is applied to the base of transistor 81. Thus, a collector current $I_{C1}$ of transistor 81 flows in an amount much larger than "$I_{SC}+I_{dut}$" so that the potential at the measuring terminal of DUT 1 is lowered. When the voltage at the measuring terminal of DUT 1 is lower than the set voltage, a voltage, lower than the counterpart of transistor 82, is applied to the base of transistor 81. Then, the collector current $I_{C1}$ of the transistor 81 flows in a smaller amount than "$I_{SC}+I_{dut}$" so that the potential at the measuring terminal of DUT 1 is increased.

The foregoing operation soon results in an equalization of the voltage at the measuring terminal of DUT 1 with the set voltage. At this time, current measuring circuit 9 measures collector current $I_{C2}$ and, from the collector current $I_{C2}$, a current $I_{dut}$ from DUT 1, can be obtained in the following manner.

When the voltage at the measuring terminal of DUT 1 becomes equal to the set voltage, the current which flows in and out of the measuring terminal becomes "0". That is, the following equation is established:

$$I_{SC}+I_{dut}-I_{C1}=0 \quad (1)$$

From the relation of the second differential circuit 8, the equation $$I_{C1}+I_{C2}=I_{SK} \quad (2)$$

is established. When this equation (2) is substituted in above equation (1), current $I_{dut}$ from DUT 1 can be obtained by measuring collector current $I_{C2}$, that is:

$$I_{dut}=I_{SK}-I_{C2}-I_{SC} \quad (3)$$

The symbol $I_{SC}$ designates the maximum current which flows into DUT 1. Since this maximum current is restricted by $I_{SK}-I_{SC}$, a limiter operation can also be obtained.

ISVM TYPE OF TEST

Control circuit 10 provides a current value applied to DUT 1 by setting current source 7 and current source 80. Then, control circuit 10 sets to the other input terminal of first differential circuit 6, a voltage which is sufficiently lower than the voltage inputted to first differential circuit 6 from DUT 1. That is, only transistor 81 is turned ON whereas transistor 82 is turned OFF. This sets the current applied to DUT 1 to a value which is obtained by adding the current from current source 7 and the current from current source 80. Then, voltage measuring circuit 12 measures the voltage at the measuring terminal of DUT 1 via buffer 11.

FUNCTION TEST

Control circuit 10 sets to 0 the current value of current sources 7 and 80. Only transistor 62 is turned ON and transistor 61 is turned OFF by applying a sufficiently high voltage to other input terminal of first differential circuit 6. When a signal is outputted to DUT 1, an input pattern is converted into a high level $V_{IH}$ pulse waveform and a low level $V_{IH}$ pulse waveform with a driver 2 so that the input pattern is outputted to DUT 1. Furthermore, when a signal is inputted from DUT 1, comparators 3 and 4 compare the levels of the output waveforms from DUT 1 with the high and low comparative voltages $V_{OH}$ and $V_{OL}$. Decision circuit 5 compares the results of the level comparisons with an expected pattern to decide whether DUT 1 is favorable or not.

In this case, current source 7 and 80 do not operate second differential circuit 8 because the values of current from current sources 7 and 80 are 0. Namely, second differential circuit 8 does not affect the function test. Moreover, first differential circuit 6 does not affect the function test in the same manner because the transistor 61 is turned OFF.

With the above structure, there has been conventionally considered an arrangement which connects voltage measuring circuit 12 to DUT 1 via buffer 11. However, no arrangement has ever been considered in the prior art which would connect the current measuring circuit 9 to the DUT 1 without using a relay to prevent adverse influencing of the function test. In other words, with the invention, current can be measured without using a relay and still not affect the function test.

Figure 3:
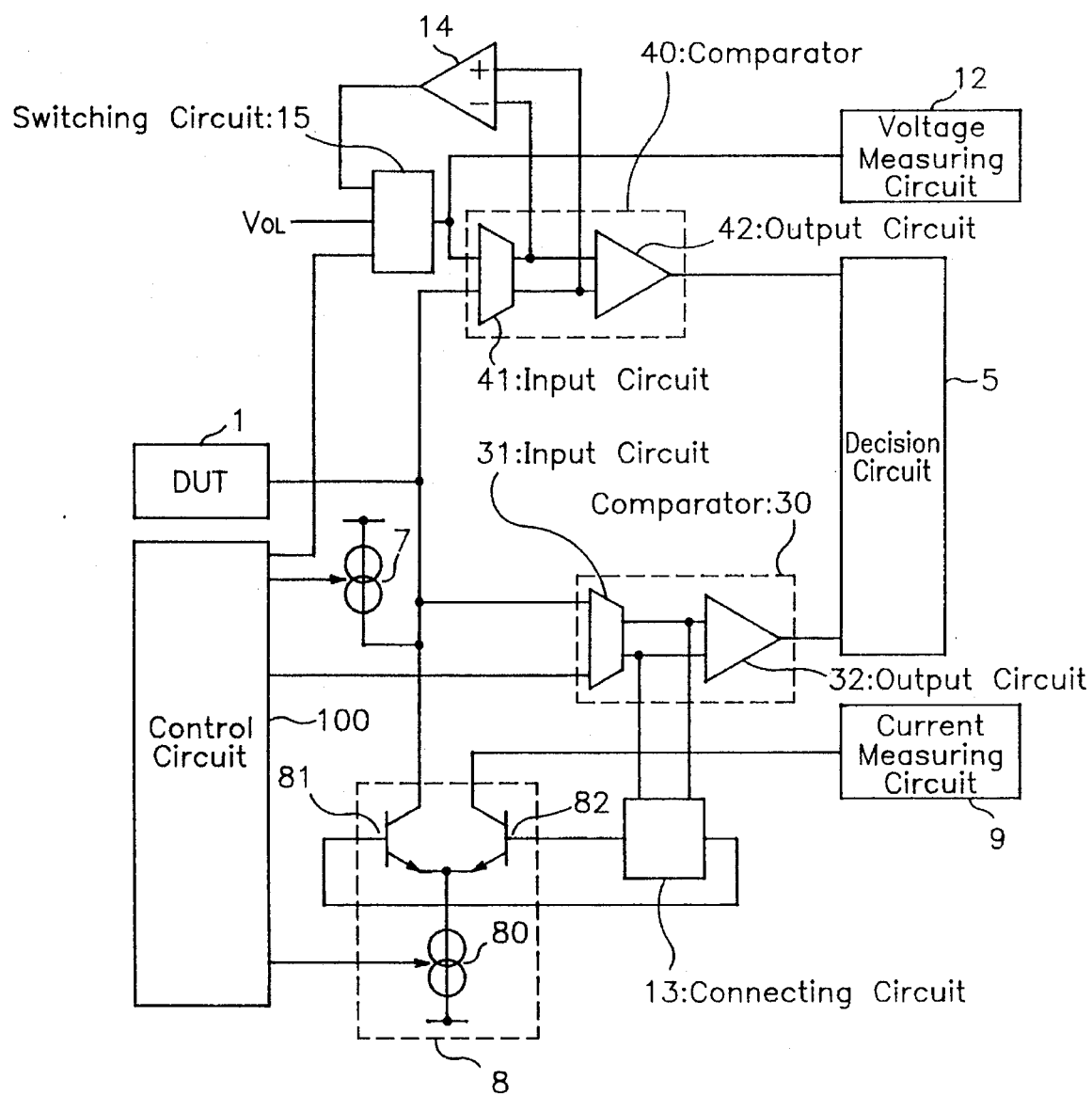
FIG. 3 is a view depicting an illustrative comparator structure of the circuit test device of the invention.
Figure 4:
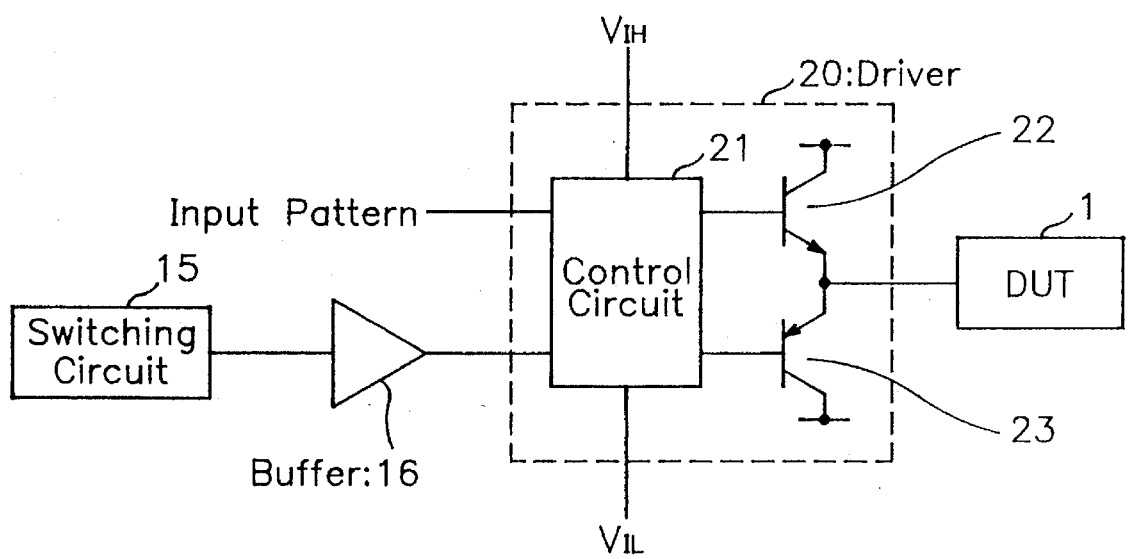
FIG. 4 is a view depicting an illustrative driver structure of the circuit test device of the invention.

In FIGS. 3 and 4, like parts are designated with like symbols as in FIGS. 1 and 2. FIG. 3 shows a comparator structure comprising comparators 30 and 40. To one of the input terminals of comparators 30 and 40, a signal from DUT 1 is inputted, which signal is compared with a signal inputted to the other input terminal of comparators 30,40 so that the decision results of the comparisons between the two signals are outputted to decision circuit 5. Comparators 30 and 40, respectively, comprise input circuits 31,41, which are differential circuits, and output circuits 32, and 42. Input circuits 31 and 41 are each provided with a buffer, comprising an emitter follower and a current source in an input stage for inputting a signal, in addition to a differential circuit 6, such as shown in FIG. 2.

The signal from DUT 1 is inputted to one input terminal of input circuit 31 so that a signal is outputted to differential circuit 8 via a connection circuit 13 and a signal is outputted to output circuit 32. In this case, connection circuit 13 serves as a circuit for converting a signal from input circuit 31 into a voltage level with which differential circuit 8 can be operated. The transistors 81 and 82 and the connections between input circuit 31 and differential circuit 8 are the same as the connections between differential circuit 6 and differential circuit 8 in FIG. 2, via connection circuit 13.

A signal from DUT 1 is inputted to one input terminal of input, circuit 41 and a signal from switching circuit 15 is inputted to another input terminal of input circuit 41 so that a signal is inputted to a positive input terminal of amplifier 14 and another signal is inputted from input circuit 41 to a negative terminal of amplifier 14. A switching circuit 15 which comprises, for example, transistors, is under the control of control circuit 100 and switches between the output terminal of amplifier 14, voltage $V_{OL}$, input terminal of input circuit 41, and voltage measuring circuit 12. The voltage value $V_{OL}$ is compared by comparator 40. Thus, input circuit 41, amplifier 14 and switching circuit 15 constitute a voltage buffer similar to buffer 11 of FIG. 2.

A control circuit 100 provides a voltage to the other input terminal of input circuit 31, like control circuit 10 of FIG. 2, thereby controlling the current in current source 7 and current source 80 of differential circuit 8 while, at the same time, controlling switching circuit 15.

FIG. 4 shows a driver structure comprising a driver 20 to which voltage values $V_{IH}$ and $V_{IL}$ and an input pattern are applied. Driver 20 outputs to DUT 1 a signal corresponding to the input pattern. In addition, driver 20 is connected to a pin of DUT 1 having the same structure as FIG. 1. Buffer 16 provides a signal from switching circuit 15 to driver 20.

Driver 20 comprises a control circuit 21, which receives a voltage signal from switching circuit 15 via buffer 16 and applies a reverse bias voltage to the bases of transistors 22,23 on the basis of a voltage signal when making the DC Test. Also, control circuit 21 outputs a signal to the bases of transistors 22,23 on the basis of the input pattern when making the Function Test. Transistors 22 and 23 are respectively an NPN transistor and a PNP transistor which comprise an emitter of the other transistor. In addition, the emitters of transistors 22 and 23 are connected to DUT 1.

The operation of the embodiments will now be explained with respect to each of the different types of tests listed below.

DC TEST

Control circuit 100 switches the output of switching circuit 15 to amplifier 14. Then, control circuit 100 operates in the same manner as control circuit 10 of FIG. 2 to perform a DC Test.

During the DC Test, based on the voltage ouputted from swithing circuit 15, control circuit 21 changes a reverse bias voltage to be applied to the bases of transistors 22 and 23. With such an operation, driver 20 is held in a high impedance state. Then, a change in the reverse bias voltage, resulting from a change in the voltage at the measuring terminal of DUT 1, is suppressed with a boot strap operation, to provide a definite level of a leak current flowing to driver 20. As a result, all that has to be done to obtain a correct current measurement value is to observe the leak current portion which enables the embodiment to produce an accurate measurement.

FUNCTION TEST

Control circuit 100 switches switching circuit 15 to provide a low comparative voltage $V_{OL}$ to the other input terminal of input circuit 41. Then, in the same manner as control circuit 10 of FIG. 2, control circuit 100 provides a high comparative voltage $V_{OH}$ to the other input terminal of input circuit 31. This allows input circuits 31 and 41 to operate as a part of comparators 30 and 40. In addition, control circuit 100 sets to 0, the current values of current sources 7 and 80.

After the current value setting has been completed as described above, the input pattern is converted into a high level $V_{IH}$ and a low level $V_{IL}$ pulse waveform with driver 2 and the waveforms are outputted to DUT 1 when the signal is outputted to DUT 1 in the same manner as the operation of FIG. 2. When a signal is inputted from DUT 1, comparators 30 adn 40 compare the output waveforms of DUT 1 with a high comparative voltage $V_{OH}$ and a low comparative voltage $V_{OL}$. Decision circuit 5 compares the results of the levels of comparison voltages $V_{OH}$ and $V_{OL}$ with an expected pattern to determine whether DUT 1 is favorable or not.

Thus, the number of circuits may be reduced when first differential circuit 6 is used in input circuit 31 of comparator 30.

The invention is not limited to the above shown circuits. For example, current source 60 of FIG. 2 may be a variable current source. Also, when testing the Function Test, the current in current source 60 may be set to 0 without turning ON transistor 62.

The foregoing describes the principles of the invention. Numerous extensions and modifications thereof would be apparent to the worker skilled in the art. All such extensions and modifications are to be considered to be within the spirit and scope of the invention.

What is claimed is:

1. A circuit test device comprising:

a first differential circuit comprising two input terminals, said first differential circuit receiving a signal from a test object;

a current source for supplying current to said test object;

a second differential circuit comprising two output terminals, said second differential circuit receiving an output signal from said first differential circuit and supplying a current from one of said two output terminals thereof to said test object;

a current measuring circuit for measuring a current flowing through said second differential circuit using the other of said two output terminals of said second differential circuit; and a control circuit for
      controlling said current source, said first differential circuit, and said second differential circuit, and for
      providing at an input terminal of said first differential circuit a set voltage for said test object when carrying out a DC test on said test object, and for
      setting a current in said current source and said current in said second differential circuit to 0 when carrying out a Function Test on said test object.

2. The device of claim 1, wherein said first differential circuit comprises an input circuit of a comparator.

3. The device of claim 1, wherein voltage applied to said test object is measured through a buffer.

4. The device of claim 3, wherein said buffer comprises an input circuit of a comparator, and an amplifier.

5. The device of claim 1, wherein a driver is provided which adjusts a leak current on the basis of a voltage at a measuring terminal of said test object when said DC Test is carried out.

\* \* \* \* \*